United States Patent
Lang et al.

(10) Patent No.: US 6,240,116 B1
(45) Date of Patent: May 29, 2001

(54) LASER DIODE ARRAY ASSEMBLIES WITH OPTIMIZED BRIGHTNESS CONSERVATION

(75) Inventors: Robert J. Lang, Pleasanton; Alexander Schoenfelder, Cupertino; Michael P. Staskus, Saratoga; John G. Endriz, Belmont; James M. Haden, San Jose, all of CA (US)

(73) Assignee: SDL, Inc., San Jose, CA (US)

(*) Notice: Subject to any disclaimer, the term of this patent is extended or adjusted under 35 U.S.C. 154(b) by 0 days.

(21) Appl. No.: 09/037,585

(22) Filed: Mar. 10, 1998

Related U.S. Application Data

(63) Continuation-in-part of application No. 08/911,500, filed on Aug. 14, 1997.

(51) Int. Cl.[7] .................. H01S 5/00; H01S 3/04; H01S 3/08
(52) U.S. Cl. ................ 372/50; 372/34; 372/35; 372/36; 372/108
(58) Field of Search .................... 372/50, 34, 35, 372/36, 108

(56) References Cited

U.S. PATENT DOCUMENTS

| | | |
|---|---|---|
| 3,622,906 | 11/1971 | Nyul . |
| 3,686,543 | 8/1972 | Nyul . |
| 4,281,896 | 8/1981 | Coccoli . |
| 4,716,568 | 12/1987 | Scifres et al. . |
| 4,719,635 | 1/1988 | Yeh . |
| 4,791,634 | 12/1988 | Miyake . |
| 4,881,237 | 11/1989 | Donnelly . |
| 4,972,427 | 11/1990 | Streifer et al. . |
| 5,025,451 | 6/1991 | Jansen et al. . |
| 5,027,359 | 6/1991 | Leger et al. . |
| 5,031,184 | 7/1991 | Greve et al. . |
| 5,040,187 | 8/1991 | Karpinski . |
| 5,099,488 | 3/1992 | Ahrabi et al. . |
| 5,105,429 | 4/1992 | Mundinger et al. . |
| 5,105,430 | 4/1992 | Mundinger et al. . |
| 5,128,951 | 7/1992 | Karpinski . |
| 5,139,609 | 8/1992 | Fields et al. . |
| 5,159,603 | 10/1992 | Kim . |
| 5,253,260 | 10/1993 | Palombo . |
| 5,284,790 | 2/1994 | Karpinski . |

(List continued on next page.)

FOREIGN PATENT DOCUMENTS

| | | |
|---|---|---|
| 0 601 485 A2 | 6/1994 | (EP) . |
| WO 97/30494 | 8/1997 | (WO) . |

*Primary Examiner*—Frank G. Font
*Assistant Examiner*—Armando Rodriguez
(74) *Attorney, Agent, or Firm*—W. Douglas Carothers, Jr.

(57) ABSTRACT

The invention relates to laser diode arrays having high beam quality and high beam brightness. In one approach, a laser diode array package includes a mount and first and second laser diode arrays disposed on the mount. Each of the laser diode arrays defines an optical axis and has an emitting surface lying in an emitting surface plane. The emitting surface plane of the first laser diode array is displaced relative to the emitting surface plane of the second laser diode array in a direction parallel to one of the optical axes. The optical axes of the first and second laser diode arrays are offset from each other in a direction perpendicular to one of the optical axes. First and second lenses are disposed relative to respective emitting surfaces to reduce divergence of light output from the emitting surfaces. In another approach, laser diode array bars are stacked and the individual output beam from each bar is collimated using a short focal length, low aberration lens. The resulting collimated beams are treated with reflectors to reduce, or remove, the dead spaces between adjacent collimated beams, thus permitting the use of low aberration lenses, which results in an improved divergence-size product for each beam produced by a bar. Additionally, the total beam output by the array of laser bars is condensed in size.

27 Claims, 14 Drawing Sheets

U.S. PATENT DOCUMENTS

| | | |
|---|---|---|
| 5,305,344 | 4/1994 | Patel . |
| 5,311,535 | 5/1994 | Karpinski . |
| 5,311,536 | 5/1994 | Paoli et al. . |
| 5,325,384 | 6/1994 | Herb et al. . |
| 5,337,328 | 8/1994 | Lang et al. . |
| 5,373,173 | 12/1994 | Ohata et al. . |
| 5,394,426 | 2/1995 | Joslin . |
| 5,495,490 | 2/1996 | Rice et al. . |
| 5,521,748 | 5/1996 | Sarraf . |
| 5,526,373 | 6/1996 | Karpinski . |
| 5,828,683 * | 10/1998 | Freitas .................. 372/36 |
| 5,987,043 * | 11/1999 | Brown et al. ............ 372/36 |

\* cited by examiner

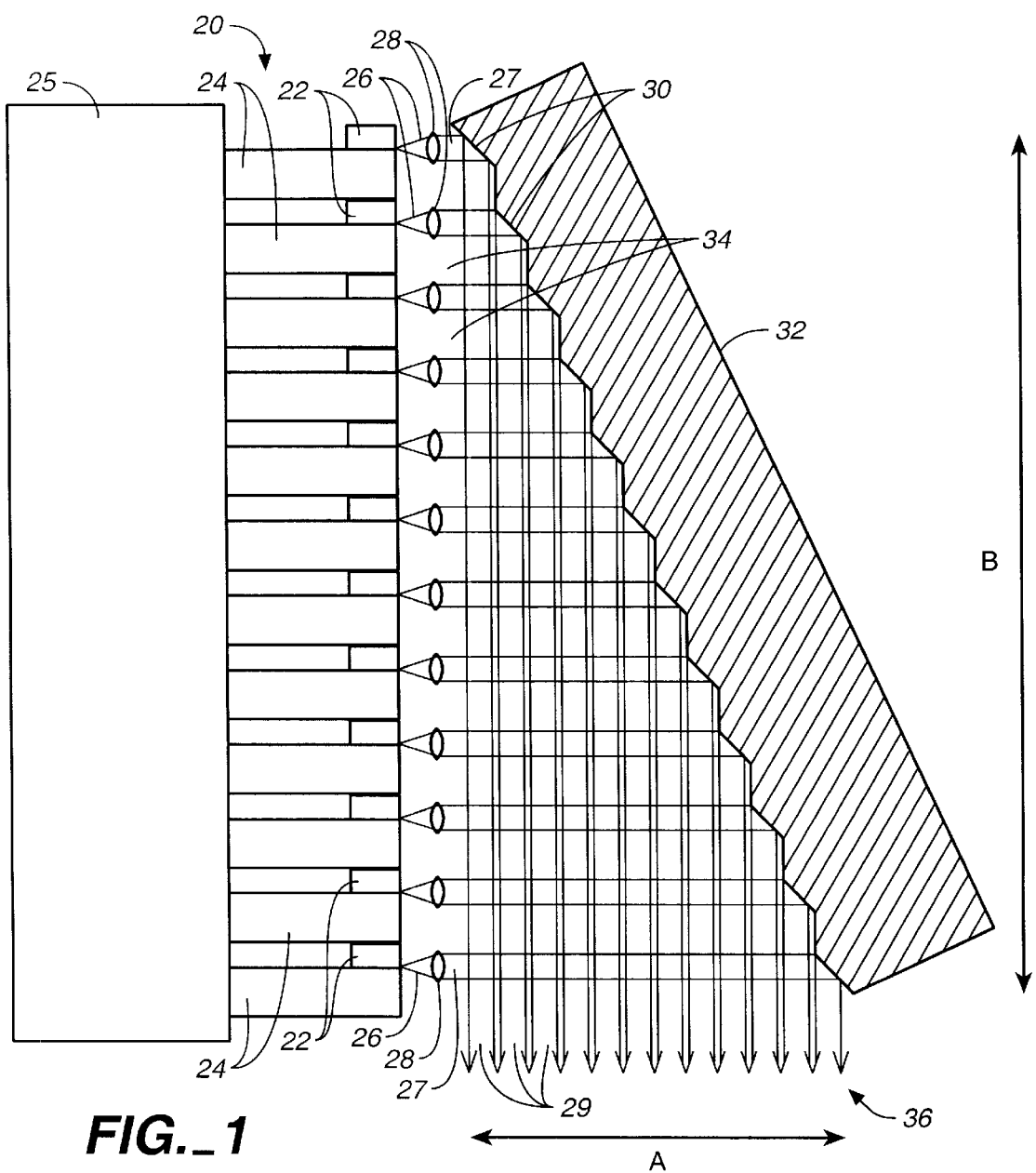
FIG._1

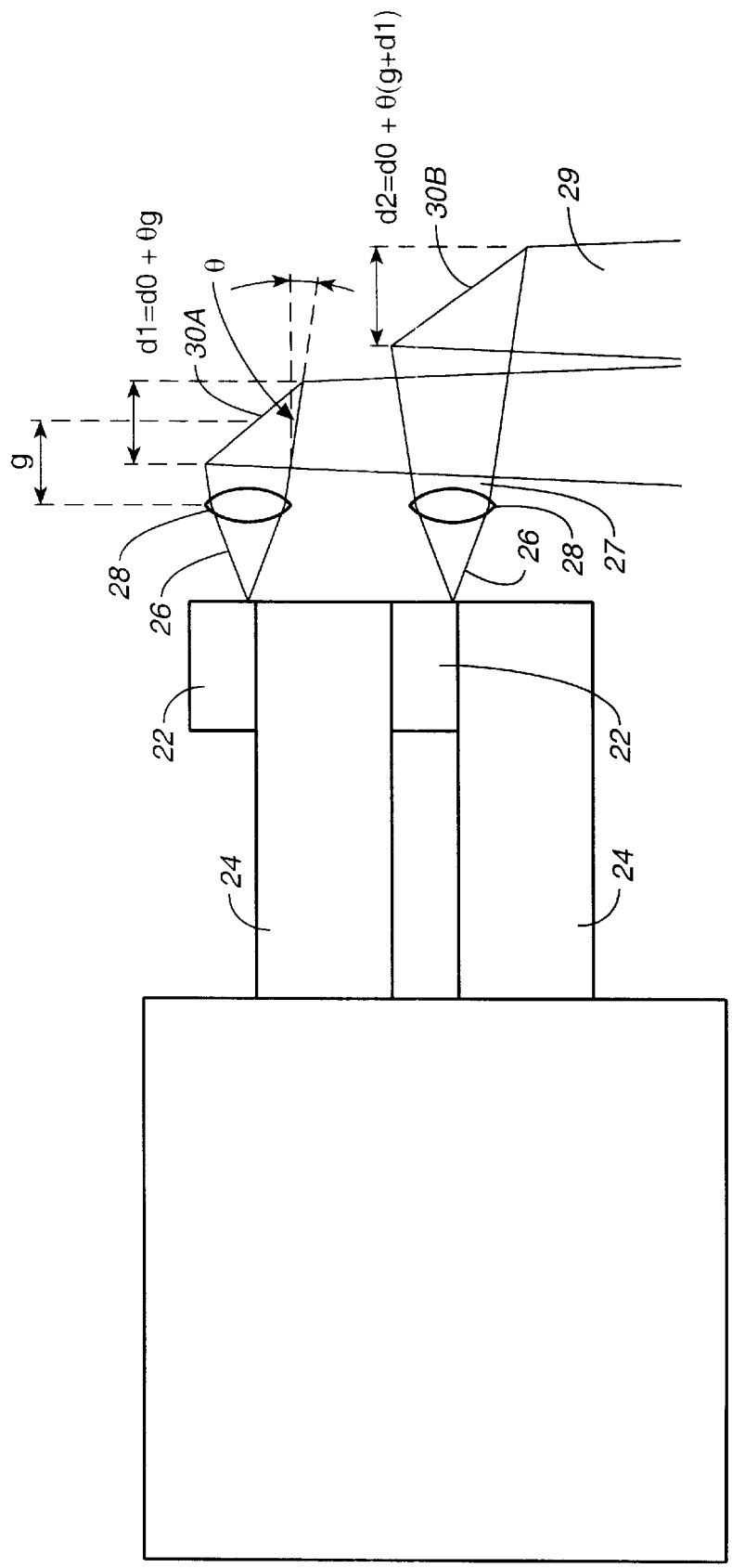
FIG._2

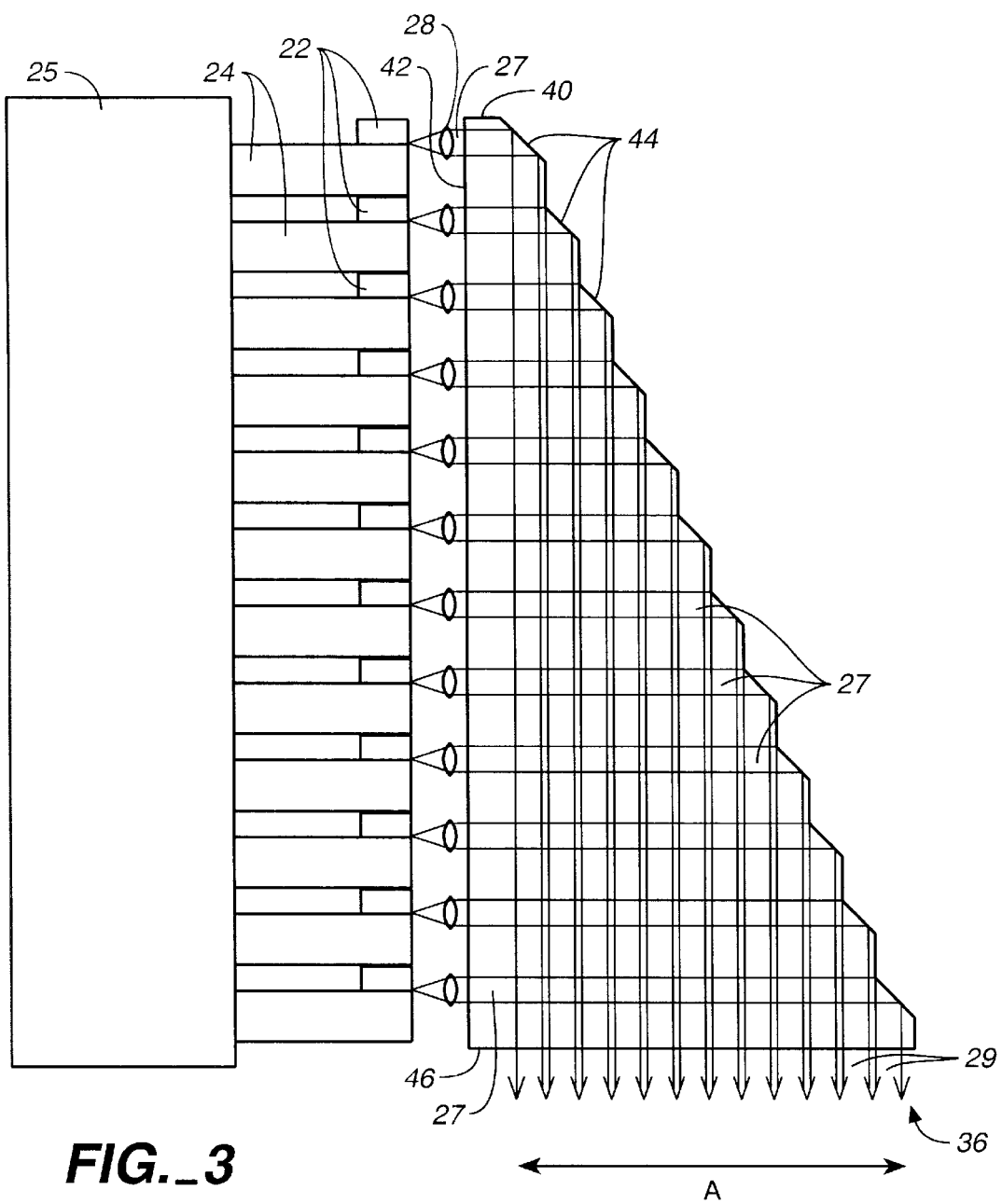
FIG._3

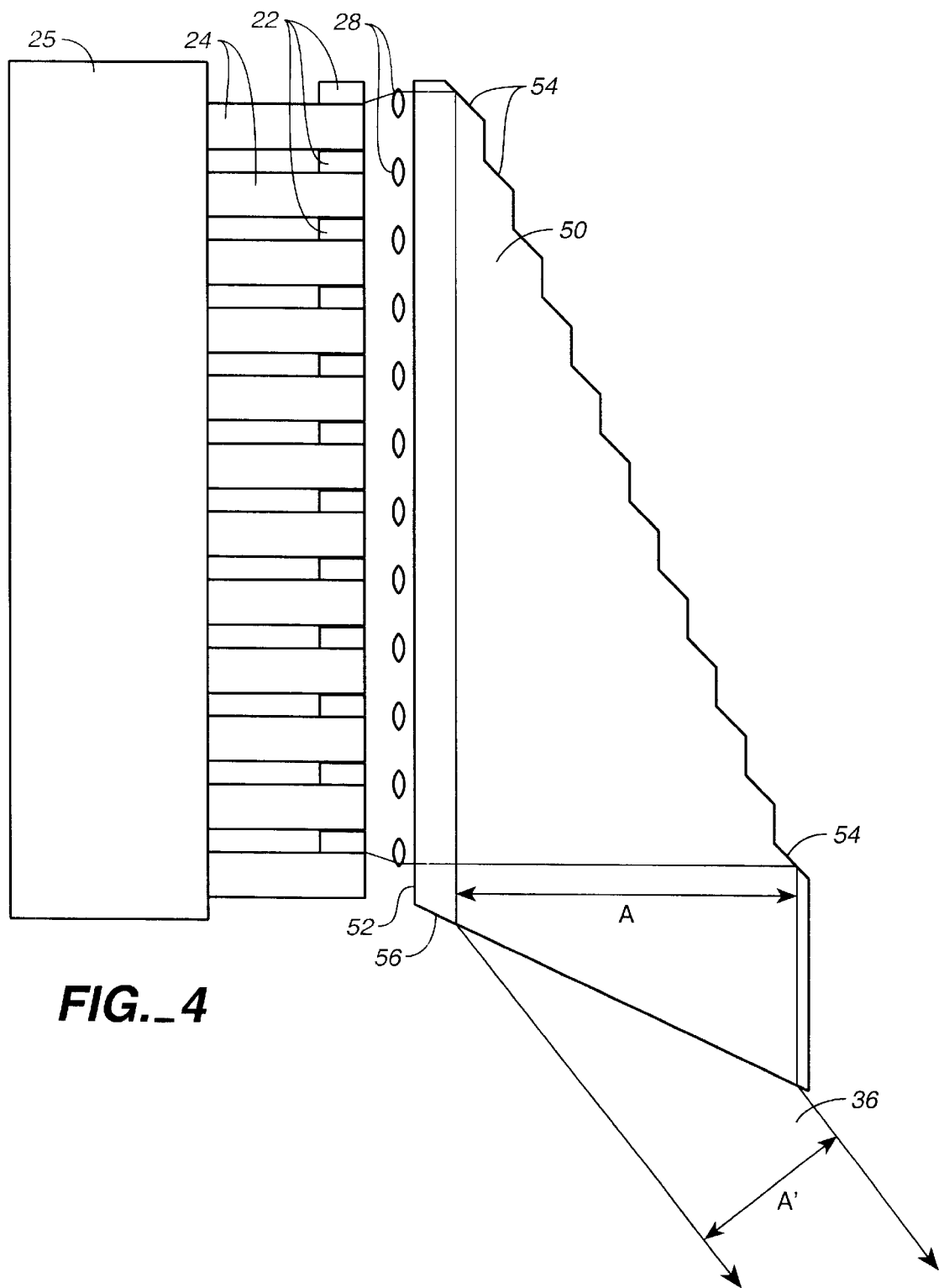
FIG._4

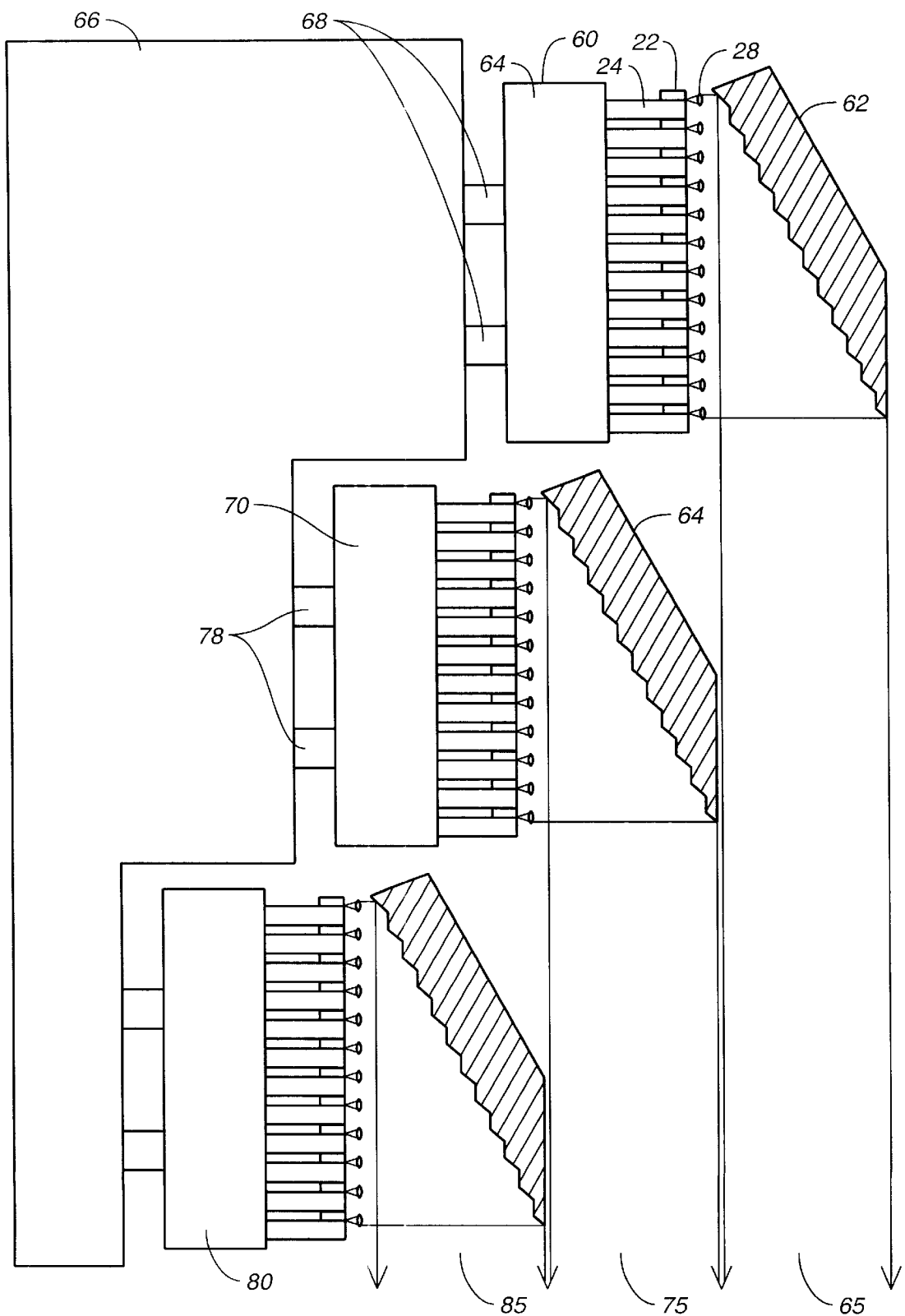
FIG._5

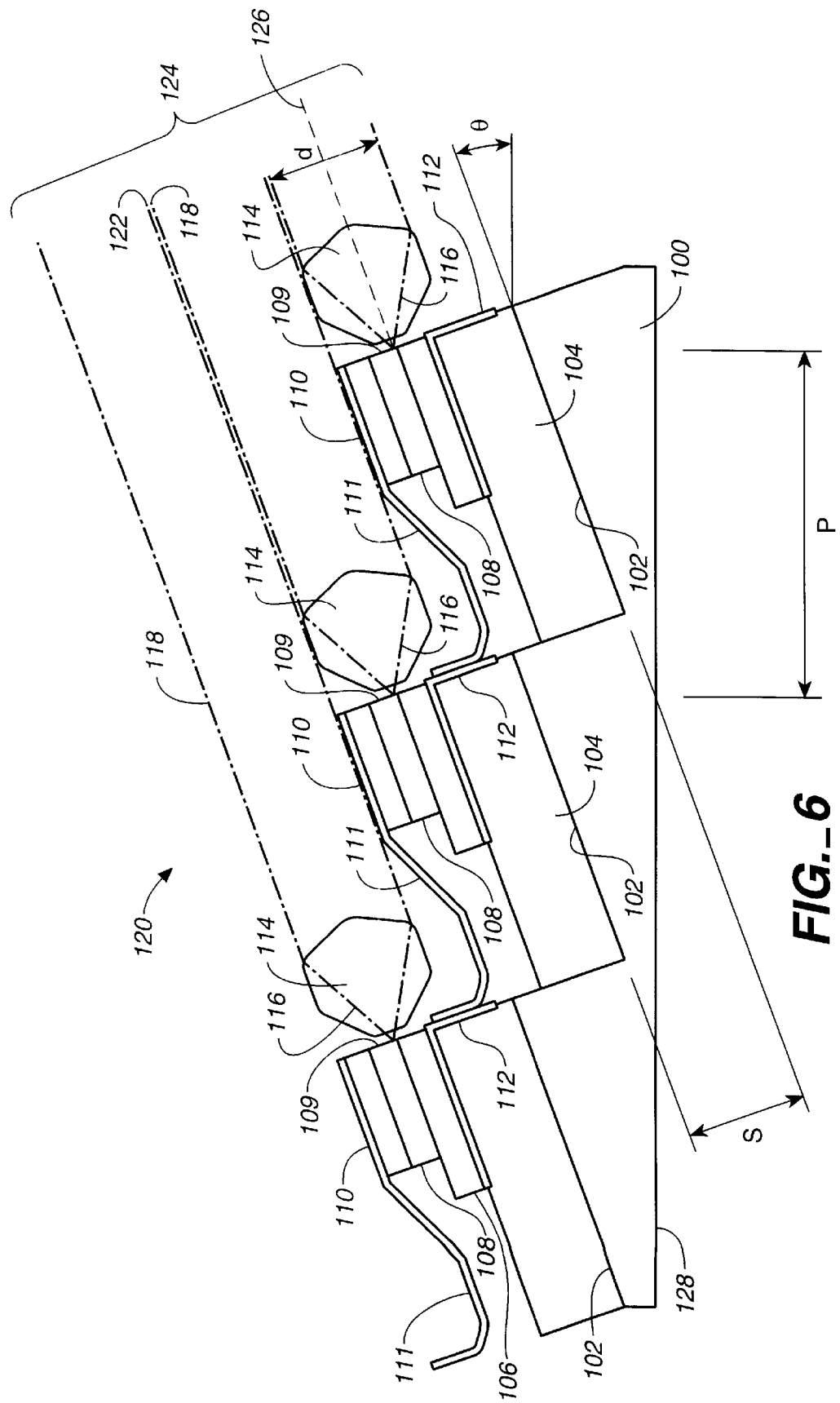
FIG._6

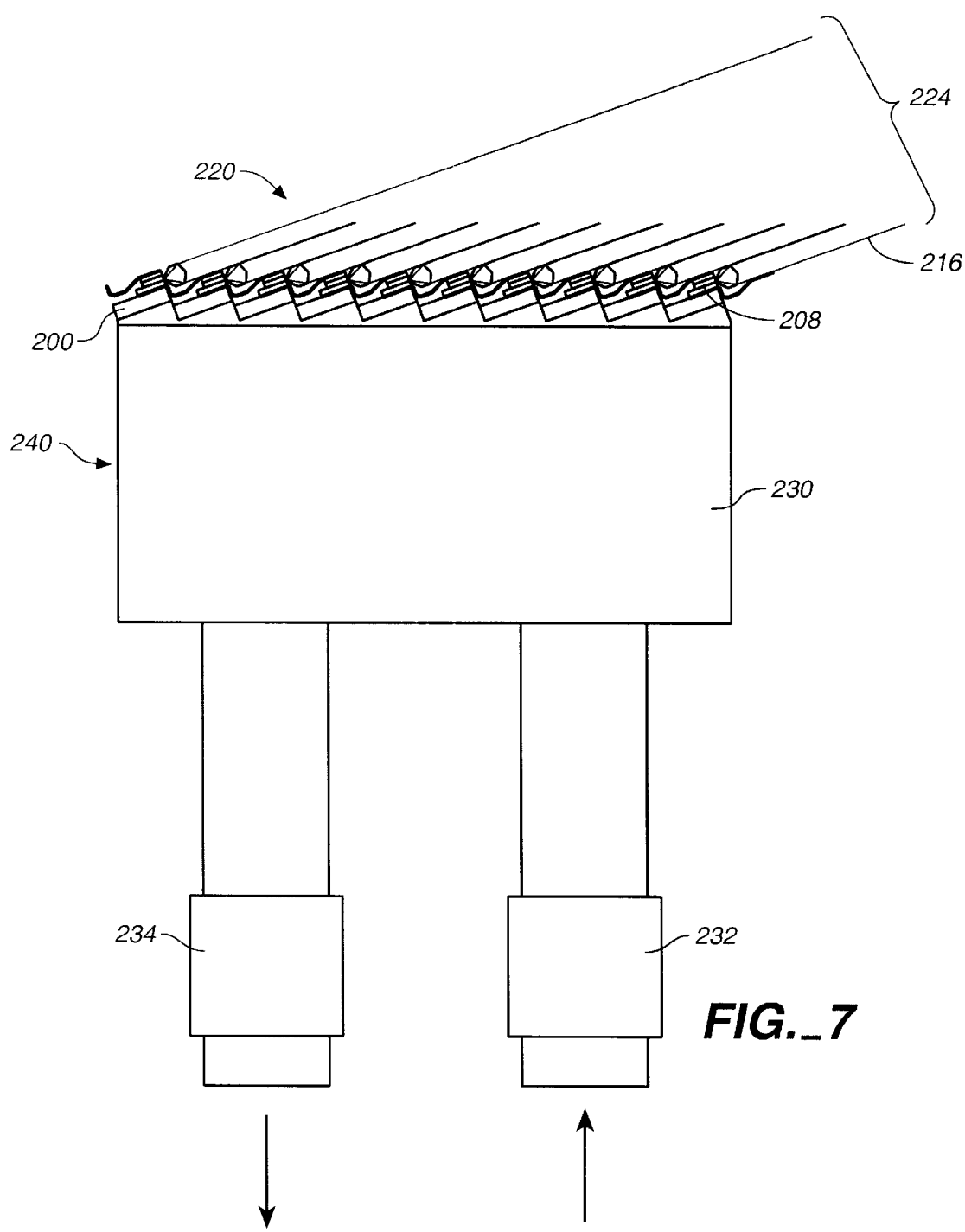
FIG._7

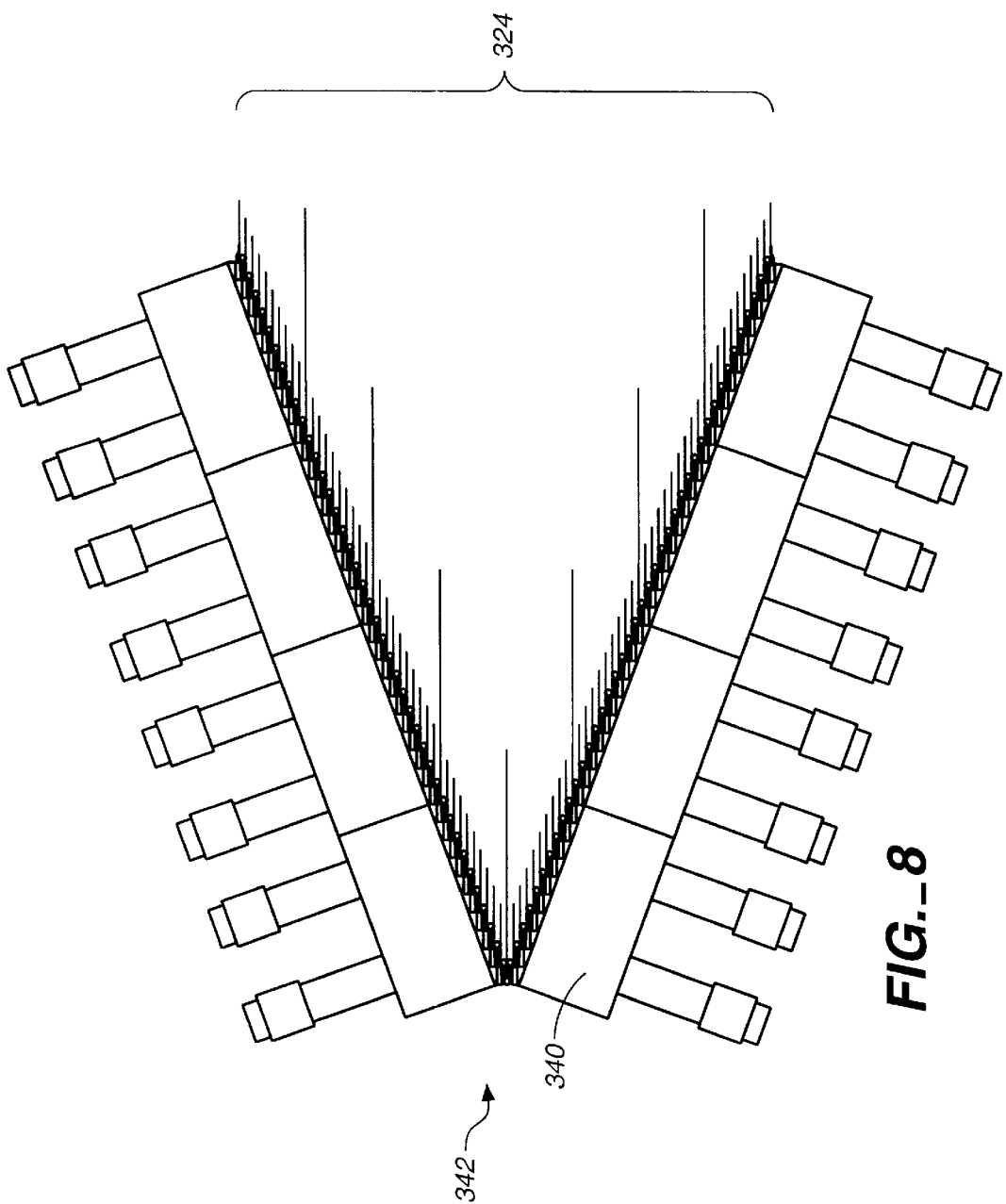
FIG._8

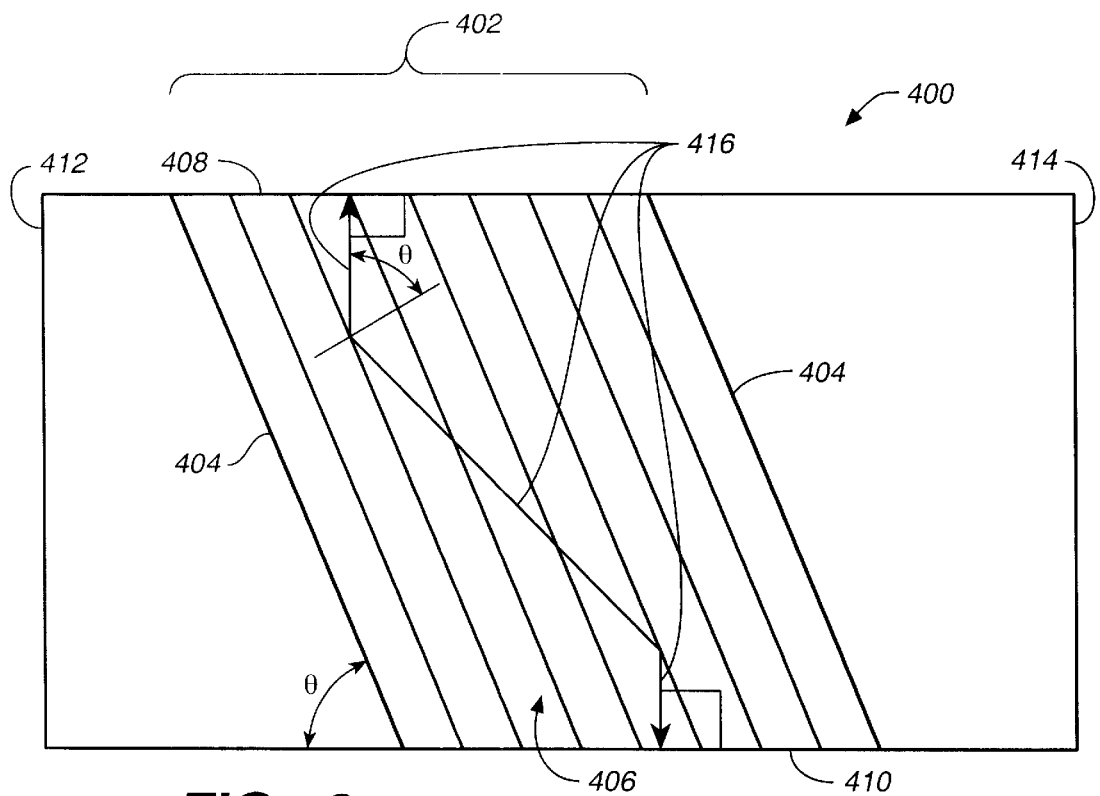
FIG._9
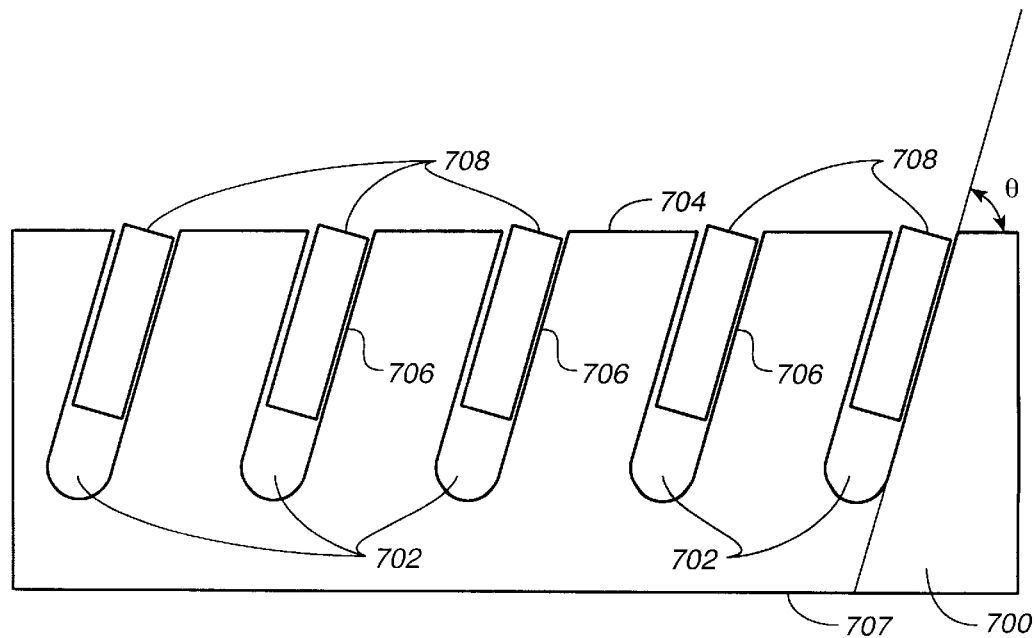
FIG._12

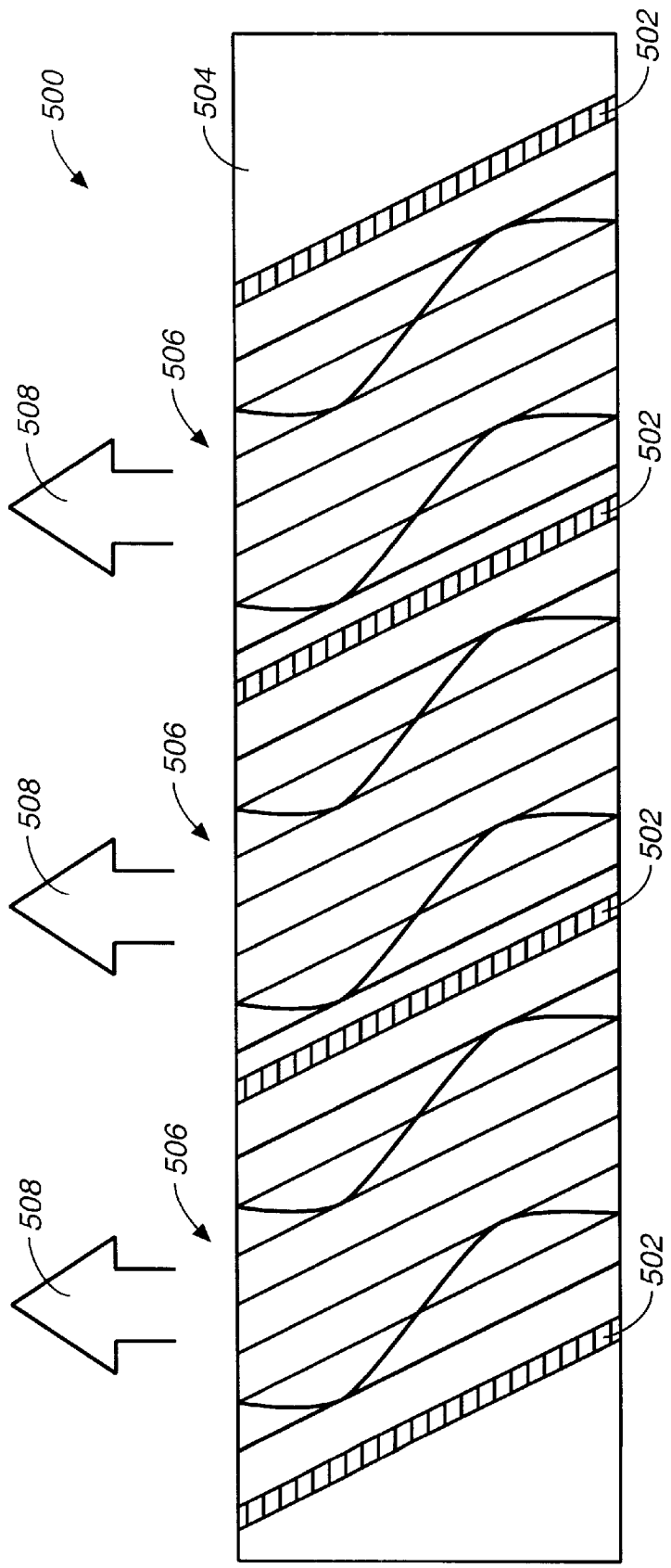
FIG._10

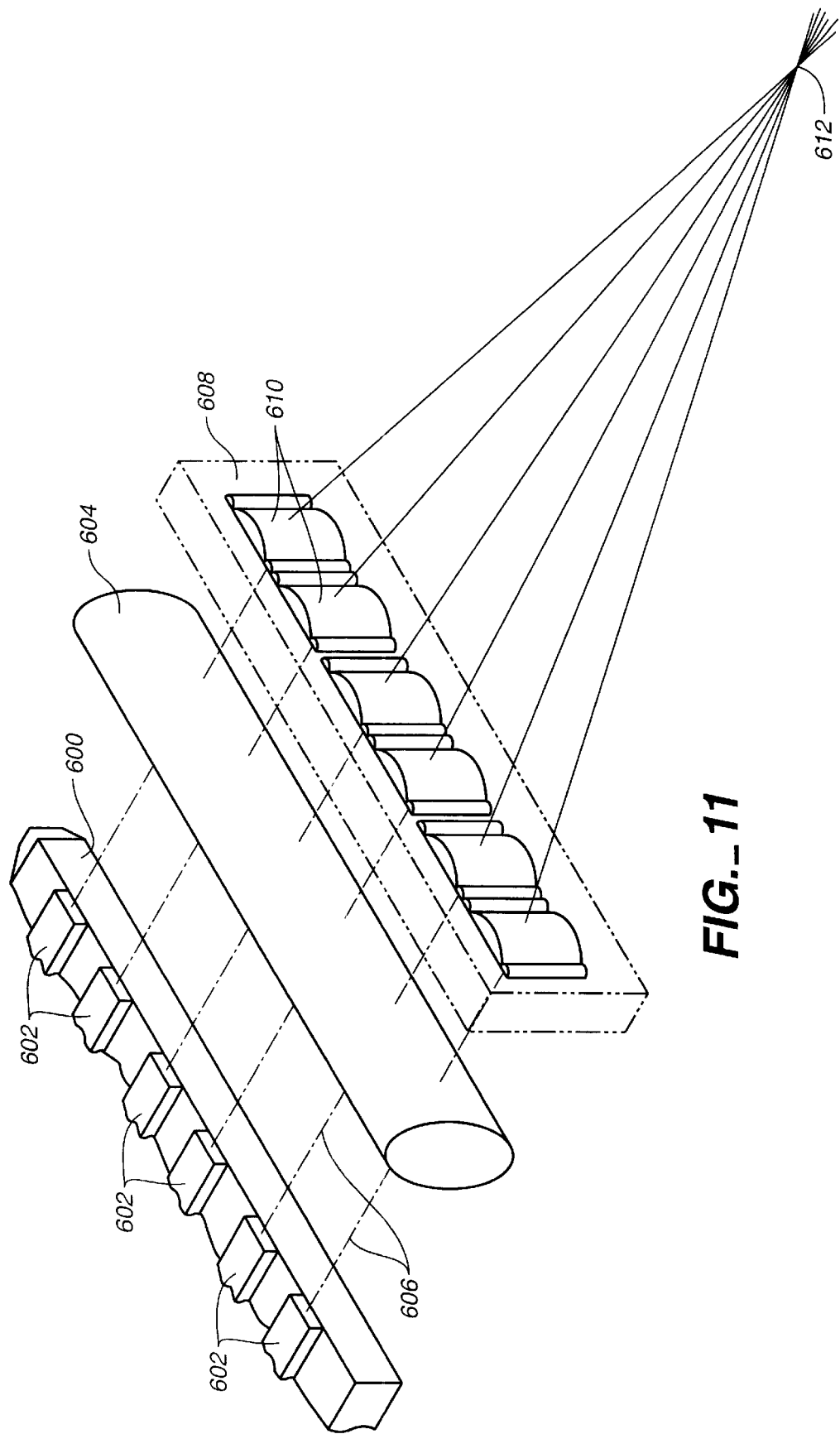
FIG._11

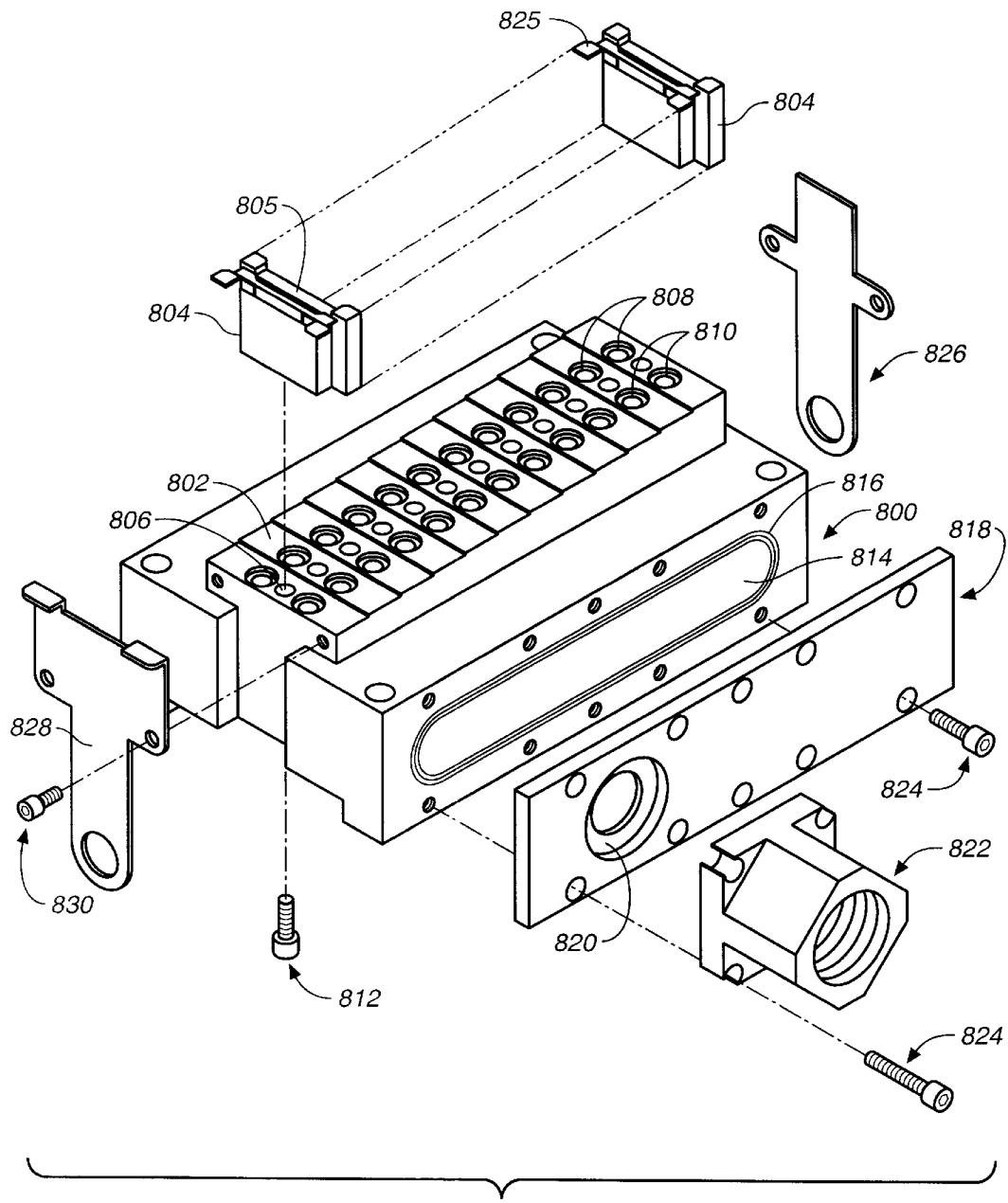
FIG._13

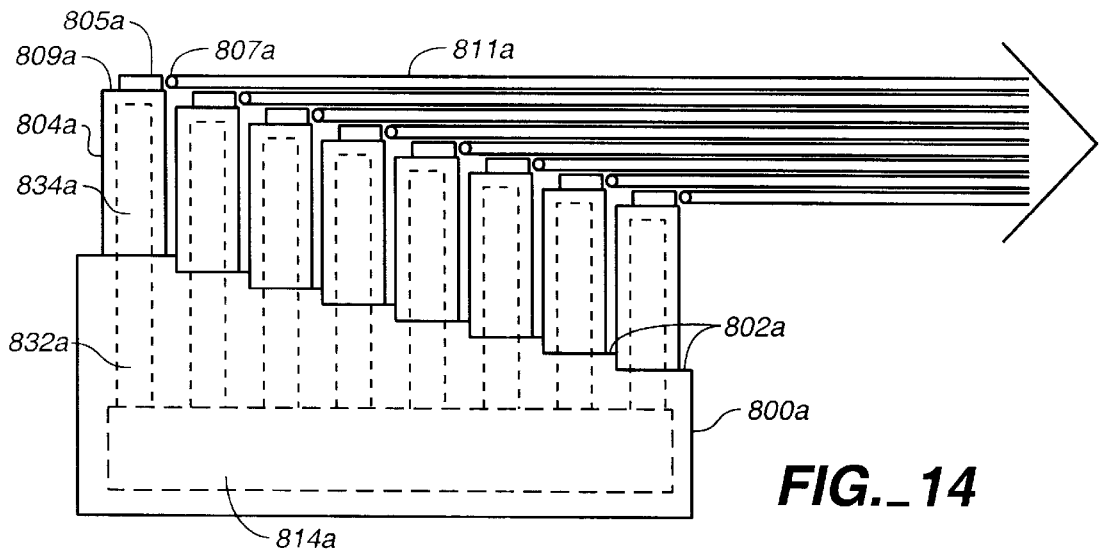
FIG._14
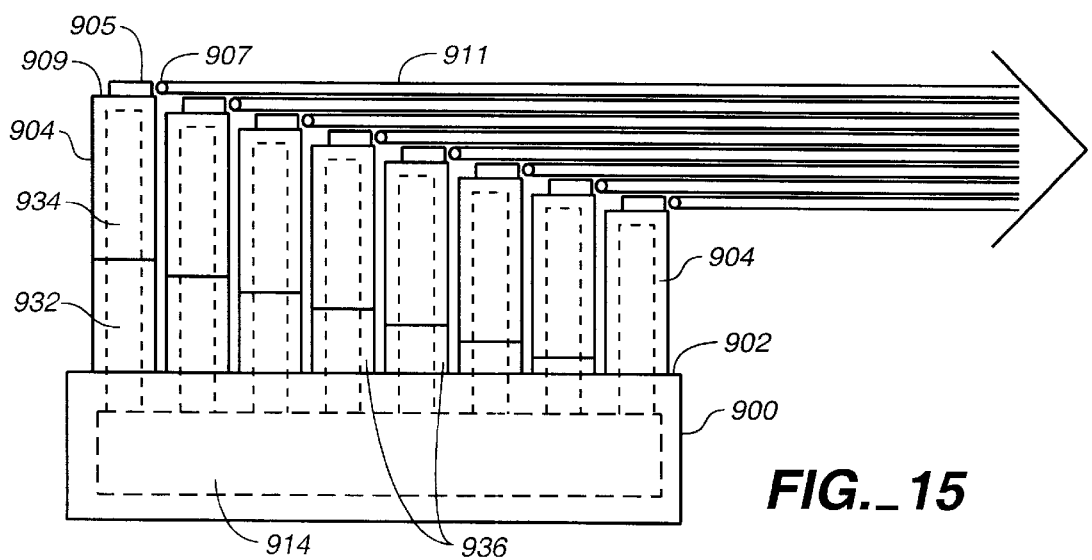
FIG._15

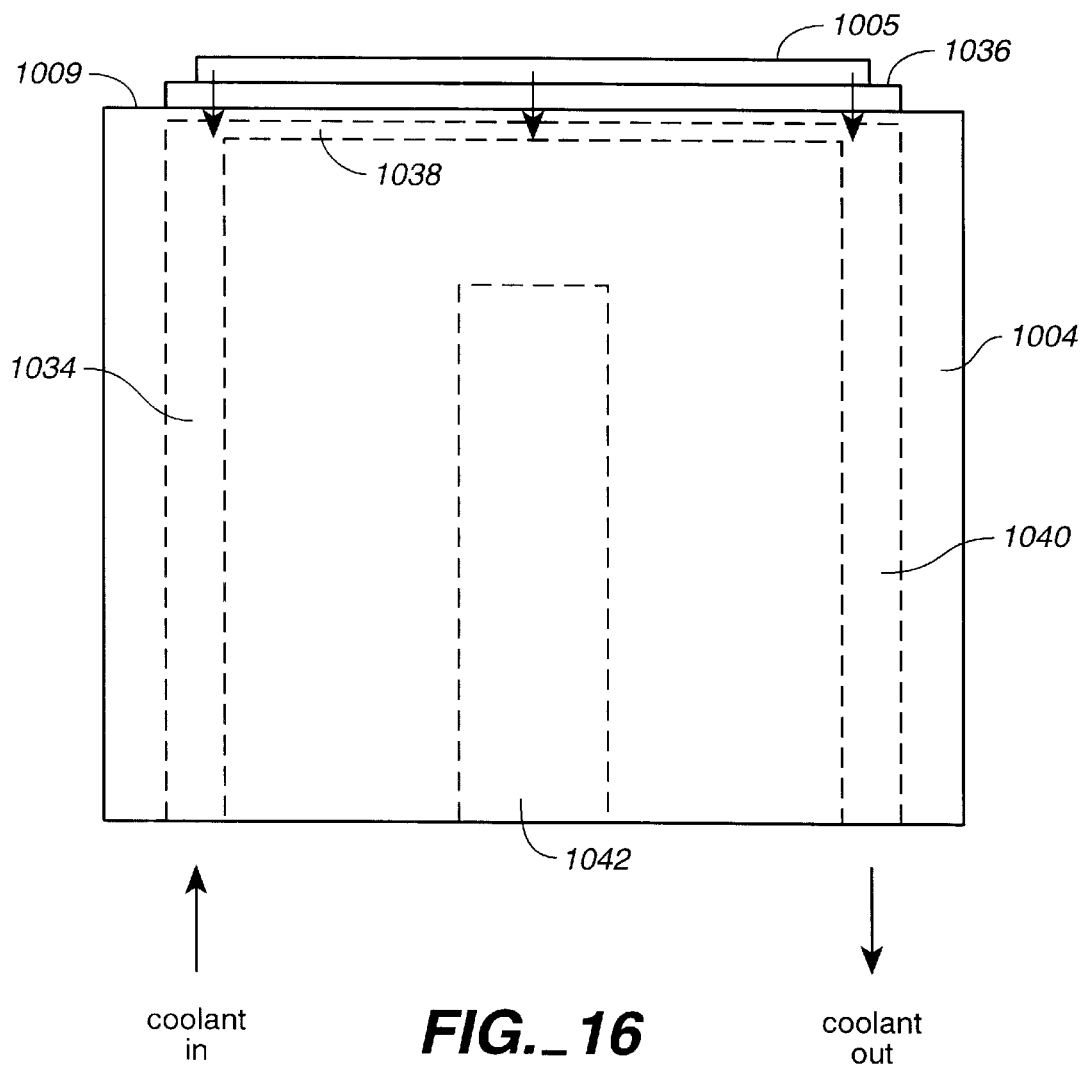
FIG._16

LASER DIODE ARRAY ASSEMBLIES WITH OPTIMIZED BRIGHTNESS CONSERVATION

This is a continuation-in-part application of U.S. patent application Ser. No. 08/911,500, filed on Aug. 14, 1997.

STATEMENT AS TO RIGHTS TO INVENTION MADE UNDER FEDERALLY SPONSORED RESEARCH AND DEVELOPMENT

The invention was supported under Government Contract No. 70NANB5H1150 through the National Institute of Standard Technology, Advanced Technology Program. The government has certain rights to the invention.

BACKGROUND

Generally, the present invention relates to semiconductor laser bars assembled in an array to produce a two dimensional array of output beams and, more particularly, to an arrangement of laser bars that provides for higher thermal conductivity of the assembled laser bars while optimizing their combined brightness.

In the manufacture of assembled semiconductor laser bars, it is customary to stack mount a plurality of laser bars with their respective submounts, as illustrated in U.S. Pat. No. 4,716,568 to Scifres et al. In laser bar stacks, the laser bars are respectively mounted on a submount and the submounts with bonded laser bars are stacked in a repetitive arrangement, possibly interspersed with heat spreaders. This is generally termed a "rack and stack" approach to forming a two dimensional array of laser emitters. The combination of a laser diode bar, a submount and a heat spreader may have a thickness of about 1 mm or more. Thus, the pitch between adjacently stacked laser diode bars may typically be between about 1 mm to 2 mm. The stacking of multiple bars provides a two dimensional array of laser emitters with a pitch between emitters of adjacent bars equal to the thickness of the laser bar/submount arrangement.

Rather than using the "rack and stack" approach, others have suggested the use of a heatsink mount or substrate with a plurality of spatially disposed grooves that are parallel with one another as well as perpendicular with the planar extent of a major surface of the mount in which the grooves are formed. A laser bar is inserted in each groove with its emitters aligned along or extending out of the major surface of the bar facing in a direction away from the grooves. Examples of this "bars in grooves with perpendicular emission" approach are disclosed in U.S. Pat. Nos. 5,040,187; 5,128,951; 5,284,790; and 5,311,535 to Karpinski.

There is a problem with both the "rack and stack" and the "bars in grooves with perpendicular emission" approaches in that the smallest pitch between adjacent laser bars has a lower limit. Thus, it is not possible to improve the density of the two dimensional array of emitters by reducing the dead space between adjacently disposed laser bars. Therefore, it is difficult to improve the optical quality of the total combined beam output, particularly to further enhance the brightness of the output achieved through higher emitter density.

A second problem with the both the "rack and stack" and the "bars in grooves with perpendicular emission" approaches is that the thermal performance of the two dimensional array is limited by dissipating heat from the laser bars principally via the rear regions of the laser bar submounts. As a result, a large pitch is maintained between adjacently mounted laser bars in order to achieve adequate cooling of the bars.

Therefore, there is a need to provide a laser diode array system which produces an output having low size-divergence product and where the dead space between the beams produced by adjacent laser bars is reduced. There is also a need to provide a two dimensional output beam array that permits closer inter-beam spacing of emitters in adjacently mounted laser bars without requiring any change in the original thickness of the laser bars/submount arrangement. There is a further need to provide a laser diode bar array with high cooling efficiency while 2 producing closely spaced output beams from the two dimensional array. Finally, there exists a need to provide a laser diode bar array that permits superior cooling of the assembled laser bars over the cooling possible from conventional the "rack and stack" and the "bars in grooves with perpendicular emission" laser bar arrays.

SUMMARY OF THE INVENTION

According to one embodiment of this invention, a laser diode array package includes a mount and first and second laser diode arrays disposed on the mount. Each of the laser diode arrays defines an optical axis and has an emitting surface lying in an emitting surface plane. The emitting surface plane of the first laser diode array is displaced relative to the emitting surface plane of the second laser diode array in a direction parallel to one of the optical axes. The optical axes of the first and second laser diode arrays are offset from each other in a direction perpendicular to one of the optical axes. First and second lenses are disposed relative to respective emitting surfaces to reduce divergence of light output from the emitting surfaces.

In another embodiment of the invention, a substrate has first and second surfaces that are substantially parallel. A plurality of angled grooves are formed on the first surface, where each of the grooves has a mounting surface disposed at an angle to the second surface, the angle ranging from more than 0° to less than 90°. Laser diode array bars are disposed within respective groove to emit light from an emitting surface at the angle. Lenses are aligned with the laser diode array bars to reduce the divergence of light emitted by the laser diode array bars in at least one dimension.

In another embodiment of the invention, a laser diode array package includes a cooler block and mounting blocks detachably mounted on, and independently removeable from, the cooler block. Laser diode arrays are disposed on diode array mounting surfaces of respective mounting blocks. Divergence-reducing lenses are positioned by respective laser diode arrays to reduce divergence of laser beams output therefrom. Diode array mounting surfaces of adjacent mounting blocks lie in planes separated by a distance approximately equal to a height of a divergence-reduced laser beam at an output of a divergence-reducing lens.

In another embodiment of the invention, a semiconductor laser diode array includes means for producing laser beams from laser diodes, the laser beams having respective optical axes, means for reducing divergence of the laser beams in at least one direction; and means for mounting the laser diodes on a cooler with emitting surfaces of the laser diodes offset from each other in a direction parallel with at least one of the optical axes.

According to another embodiment of the invention, laser diode array bars are stacked and the individual output beam from each bar is collimated using a short focal length, low aberration lens. The resulting collimated beams are treated with reflectors to reduce, or remove, the dead spaces between adjacent collimated beams, thus permitting the use of low aberration lenses, which results in an improved divergence-size product for each beam produced by a bar. Additionally, the total beam output by the array of laser bars is condensed in size.

The above summary of the present invention is not intended to describe each illustrated embodiment or every implementation of the present invention. Other objects and attainments, together with a fuller understanding of the invention will become apparent and appreciated by referring to the following description and claims taken in conjunction with the accompanying drawings.

BRIEF DESCRIPTION OF THE DRAWINGS

The invention may be more completely understood in consideration of the following detailed description of various embodiments of the invention in connection with the accompanying drawings, in which:

FIG. 1 illustrates a stepped condensing reflector according to an embodiment of the invention;

FIG. 2 illustrates a stepped condensing reflector having reflecting surfaces of varying size;

FIG. 3 illustrates a totally internally reflecting stepped condensing reflector;

FIG. 4 illustrates a totally internally reflecting, stepped reflector having an off-axis output surface for additional beam condensing;

FIG. 5 illustrates a number of laser diode array units operating with stepped condensing reflectors;

FIG. 6 illustrates a stepped mount according to an embodiment of the present invention;

FIG. 7 illustrates a water cooled laser diode array using the stepped mount of FIG. 6;

FIG. 8 illustrates a high powered laser diode array using stepped mounts;

FIG. 9 illustrates a laser diode having an angle grating for transverse mode control;

FIG. 10 illustrates an array of laser diodes having angled gratings;

FIG. 11 illustrates a laser diode array having a lenslet array for conditioning the output beam;

FIG. 12 is a side elevation of an assembled array of plural laser bars mounted in a heatsink mount at an angle with respect to the planar extent of a major frontal surface of the heatsink mount;

FIGS. 13 and 14 illustrate a modular stepped mount according to another embodiment of the present invention;

FIG. 15 illustrates another modular stepped mount according to another embodiment of the invention; and FIG. 16 illustrates a microchannel mounting block for a laser diode bar.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to high power laser diode arrays. The present invention is believed to be particularly suited for use in producing a high brightness output having a uniform intensity profile from a laser diode array, and is applicable in high power and very high power laser diode systems. The present invention is also suited for improving the ability to extract heat from laser diode array bars operating at high power levels. While the invention is not so limited, an appreciation of the invention will be gained through the following discussion of various examples.

The divergence of an output beam from a laser diode or laser diode array bar remaining after collimation in the direction of fast divergence is due to several independent components, including diffraction-limited divergence, spherical aberration and bow-tie aberration (coma). Spherical aberration and bow-tie aberration can be reduced by judicious choice of lens shape. For example, an a circular cylindrical lens produces less spherical aberration than does a cylindrical lens having a circular profile. Additionally, bow-tie aberration may be reduced by reducing the divergence of light in the slowly diverging direction, perpendicular to the fast axis, and by placing the lens closer to the output facet of the laser diode array bar. Consequently, the use of lenses having a height ranging, for example, from 50–500 $\mu$m, produces beams having lower size-divergence product (SDP) than is achieved with larger lenses. However, since the laser beams are collimated at a small size to improve the beam quality, there remain significant dead spaces between adjacent collimated beams.

One particular embodiment of the invention for reducing the dead space between beams produced by an array of diode laser bars is illustrated in FIG. 1. An array assembly of diode laser bars 20 is shown, that includes a stack of diode laser bars 22 mounted on heat spreaders 24. Each heat spreader 24 is attached to a cooling block 25 that may be water cooled. No electrical connections to the diode lasers are shown, but it will be appreciated that electrical connections are made between laser diode bars 22 and also to an external power supply (not shown).

The diverging output beams 26 from each laser diode bar 22 are collimated by respective collimating lenses 28, to produce collimated output beams 27. Each collimated output beam 27 is incident on a respective off-axis reflecting surface 30. It is convenient to mount the reflecting surfaces 30 on a single stepped reflector 32, but this is not a limitation of the invention. Typically, the collimated output beams 27 are parallel and the reflecting surfaces 30 are parallel, so that all the reflected beams 29 emerge in a parallel direction. However, it will be appreciated that if the collimated beams 27 are not parallel, judicious adjustment of the position and orientation of the reflecting surfaces 30 may result in the parallelization of the reflected beams 29. Dead spaces 34 between adjacent collimated beams 27 are reduced by positioning the reflecting surfaces 30 in individual planes, as illustrated. Prior to reflection by the reflecting surfaces 30, the output from the laser diode array 20 has a total width equal to B. Substantial removal of the dead spaces 34 between collimated beams 27 by reflecting off the reflecting surfaces 30 results in condensing the total output beam 36 to having a width equal to A, which is significantly less than B. This compression is achieved without altering the size of any of the collimated beams 27.

It will be appreciated that the reflecting surfaces 30 may be oriented and positioned differently from the arrangement illustrated. For example, the reflecting surfaces may 30 be oriented so that the angle of incidence of the collimated beam may be less than 45°. In such a case, the separation between adjacent reflecting surfaces 30 along the direction parallel to the optical axes of the diode laser bars 22 may be less than in the example illustrated in order to substantially remove the dead spaces.

This embodiment of the invention permits the use of a small collimating lens 28, to collimate the output beam 26 from each laser diode bar 22 with the result that each collimated beam 27 has reduced aberration and thus has a low SDP. For example, the contribution to the divergence of the collimated beam 27 resulting from bow-tie aberration may be reduced to being less than the contribution to the divergence arising from natural diffraction of the beam. In other words, less than half of the total divergence of a collimated output beam 27 is attributable to bow-tie aberration.

The stepped reflector 32 may be fabricated from a metal or a dielectric. It will be appreciated that the reflecting surfaces 30 may be treated, for example, with a dielectric coating to reflect the collimated beams 27 efficiently.

In order to increase the condensing ratio (B/A), it is possible to set the width of each reflecting surface 30 according to its distance from the associated collimating lens 28, as is illustrated in a simplified diagram in FIG. 2. Here, only the outputs 26 from two diode laser bars 22 are shown for clarity. After propagating through the collimating lenses 28, each collimated beam 27 typically has a residual divergence, θ, of approximately 15 mrad. The divergence is exaggerated in the figure. Thus, reflecting surfaces 30 that are closer to the lenses 28 intersect smaller collimated beams 27 than those reflecting surfaces 30 that are further away from the collimating lenses 28.

In illustration, consider reflecting surface 30A positioned at a distance g from the collimating lens 28. If it is assumed that the beam emerging from the collimating lens 28 has a width of d0, then the width of the collimated beam 27 on the reflecting surface 30A may be approximated as d1, where d1 equals d0+θg. The second reflecting surface 30B intersects a collimated beam 27 having a size of d2, where d2 equals d0+θ(g+d1). Other reflecting surfaces 30 positioned at an increasing distance from their associated collimating lenses 28 may also be provided with correspondingly increased widths. Therefore, by setting the size of each reflecting surface 30 to be the same as the size of the beam it reflects, the width of the beam emerging from the stepped reflector 32 is smaller than where the reflecting surfaces 30 are all equal in size and are sufficiently large to reflect the entirety of each collimated beam 27.

Another embodiment of a stepped reflector is illustrated in FIG. 3, in which the stepped reflector 40 operates under total internal reflection (TIR). Each collimated output beam 27 enters an input face 42 of the TIR stepped reflector 40. The stepped reflector 40 is provided with a series of totally internally reflecting surfaces 44 associated with each collimated beam 27. The total output 36 is a combination of all of the reflected beams 29 aligned with reduced dead spaces therebetween. The output beam 36 exits the output surface 46 of the TIR stepped reflector 40. Both the input surface 42 and the output surface 46 may be provided with anti-reflection coatings to reduce reflective losses.

Another embodiment of a totally internally reflecting stepped reflector 50 is illustrated in FIG. 4. In this figure, only the marginal rays of the end laser diode bars 22 are shown, and the other rays have been excluded for clarity. The TIR stepped reflector 50 is provided with an input face 52 to receive the output from each laser diode bar 22. The reflecting surfaces 54 are provided to reflect each on the collimated beams from the diode lasers. The output face 56 of the TIR stepped reflector 50 is at an angle relative to the beams reflected off the reflecting surfaces 54, and thus the output face 56 acts as a prism to deflect the output 36 as it exits from the TIR stepped reflector 50. Thus, once the output 36 has passed out of the TIR stepped reflector 50, it has a dimension of a A', compared to a dimension A within the stepped reflector 50. The SDP is maintained on passing through the exit face 56, but the overall beam dimension is reduced, thus increasing the divergence. An advantage of this embodiment is that higher output powers may be obtained.

Multiple modules may be assembled on a stepped manifold for increasing the total output power of a diode laser array system, as illustrated in FIG. 5. A module 60 includes a number of laser diode bars 22 mounted on heat spreaders 24 that are thermally connected to a cooling block 64. Each laser diode bar 22 has an associated collimating lens 28, and a stepped reflector 62 reflects the collimated output from each laser diode. The corresponding module output 65 has little or no dead space between individual beamlets. The module 60 is connected to a stepped manifold 66 via tubes 68 for carrying coolant to remove heat from the module 60 generated by the laser diode bars 22. Additional modules 70 and 80 may be added to the stepped manifold 66 to increase the total output from the unit by adding together outputs 75 and 85 from each module. It will be appreciated that a number of such modules may be stacked in this manner, to produce a system having a high power output with a low SDP, and with reduced dead spaces between beamlets.

FIG. 6 illustrates another embodiment of the invention, in which dead space is reduced by changing the spatial relationship between adjacent laser diode array bars while also significantly improving the thermal conductivity properties and thermal path to the heatsink or cooling plate. A cooler plate 100 is provided with a plurality of steps 102 on the surface opposite to its heat drawing surface 128, which may be in thermal contact with a circulating fluid or a thermo-electric cooler. The steps 102 may also be referred to as grooves. Mounted on each step 102 of the plate 100 is a heat spreader 104. A thermally and electrically conductive sub-mount 106 is mounted on the heat spreader 104. A laser diode bar 108 is mounted on the submount 106, and a conductive cap 110 is mounted on the laser diode bar 108. It will be appreciated that the laser diode bar 108 may be composed of multiple emitters or a single emitter.

In this embodiment, the emitting surfaces 109 of each laser diode bar 108 define an emitting surface plane having a plurality of aligned emitters. These emitting surface planes are parallel to, and offset from, each other.

If the heat spreader 104 is not an electrical conductor, then an electrically conducting tab 112 may be provided between the submount 106 and the heat spreader 104. The heat spreader 104 serves to remove heat by providing a thermally conducting path having a low thermal resistance between the laser diode bar 108 and the heat drawing surface 128. A bus 111 directly connects from the top of a cap 110 of one laser diode bar 108 to the submount 106 of the adjacent laser diode bar 108, or to a tab 112 corrected to the submount 106. Such an electrical arrangement permits multiple laser diode bars 108 to be electrically connected in series, if desired. This electrical arrangement is not limiting, and the laser diode bars 108 may be connected in any manner that does not impact the amount of dead space in the output beam. For example, adjacent laser diodes may be connected by conducting tabs at their edges, so as to be removed from the region of the output beam. The heat spreaders 104 may be formed from an electrically conductive material, for example, copper or the like, or from an electrically insulating, high thermal conductivity material, such as diamond, sapphire, beryllia, alumina, aluminum nitride, various composites thereof, or the like.

A collimating lens 114 is provided to collimate the output 116 from each laser diode bar 108. The collimating lens 114 collimates the laser output 116 along its fast axis, i.e. the axis of high divergence. The collimating lens 114 may be, for example, an optical fiber, or may have an a circular profile as in the example illustrated. This embodiment permits the collimating lens 114 to be placed close to the output of each diode bar 108. Consequently, the bow-tie aberration component of the divergence of the collimated output beam 116 may be less than the diffraction-limited component, while the total output beam has reduced dead spaces.

To reduce the size of the dead space 122 between collimated beams 118, the collimated beam 118 from one laser diode bar 108 passes close to the top of the cap 110 of an adjacent laser diode bar 108 so as to propagate in close proximity to the collimated output 118 from the adjacent laser diode bar 108. Consequently, there is little or no dead space 122 between the individual collimated beams 118 from each laser diode bar 108, resulting in a laser diode array output 124 which is generally rectangular in shape and has an essentially uniform intensity profile.

Where the laser diode bars 108 have a regular spacing therebetween, the angle, θ, between the optical axis 126 of a laser diode bar 108 and a plane passing through the intersecting points between the optical axis 126 and the emitting surface 109 of each laser diode bar 108 may be described by the relationship $\sin\theta = S/P$, where P is the pitch between laser diode bars 108 and S is the height of the step 102. The angle θ lies in the range 0°–90°. To minimize the size of dead space 122, the step height, S, is equal to the height of the collimated beam 118. A small step height also reduces the length of the thermal path from the laser diode bar 108 to the cooling medium and increases the footprint of the laser diode bar 108 and the heat spreader 104 on the cooling plate 100. Accordingly, the step height may be less than the height of a laser diode package, where the package includes the laser diode bar 108 and the submount 106, and also the heat spreader 104 if one is present.

The step height may also be larger than the height of the laser diode package. This may permit the use of collimating lenses shaped differently from the collimating lenses 116 illustrated, and may permit the lenses to be mounted at a greater distance from the laser diode bar 108 than illustrated, thus making mounting tolerances less critical. It will be appreciated that different step heights and different laser diode package heights may be present in a single assembly if required for a particular application.

To further reduce dead spaces 122 between adjacent collimated beams 118, the collimated beam 118 fills the collimating lens 114, and so each collimated beam has a height equal to d. The height of the dead space 122 is preferably less than 100% of width of the collimated beam 118 and more preferably less than 10% of the width of the collimated beam 118.

This embodiment also enhances the thermal management of the laser diode array. In a "rack and stack" laser diode array, the heat generated by the laser diodes passes through submounts to heat spreaders, and the heat is typically extracted through the back planes of the heat spreaders in a direction perpendicular to the direction in which heat is extracted out of the diode bar. In contrast, this embodiment provides lower thermal resistance to the passage of heat between the laser diode bar 108 and the heat drawing, or cooled, surface 128 of the cooler plate 100. This is mostly a result of exposing a larger effective area of the heat spreader 104 to the heat drawing surface 128.

Another embodiment of the invention is illustrated in FIG. 7, in which a stepped cooler plate 200 is attached to a liquid cooled cooling block 230. The cooling block 230 has an inlet 232 and an outlet 234 for liquid coolant. The stepped cooler plate 200 is provided with a number of laser diode bars mounted on steps, in a manner similar to the embodiment illustrated in FIG. 6. The back surface of the cooling plate 200 may be in direct contact with the liquid coolant circulating through the cooling block 230. The output 224 of the integrated unit 240 appears to a user as rectangular in shape with a uniform intensity distribution, substantially lacking in dead spaces. The output 224 is formed by the addition of a number of individually collimated beams 216 emitted from respective laser diodes 208.

A unit such as is illustrated in FIG. 7 may be combined to form a very high power laser diode source, as shown in FIG. 8. The source 342 employs a number of units 340 placed in a "V" pattern. By stacking these units 340 together, a very high power output 324 may be obtained. For example, if each unit 340 incorporates 10 bars each 1 cm long, and each bar produces an output of 40 W, then each unit 340 generates an output of 400 W. The "V"-shaped source 342 therefore produces approximately 3200 W in a beam 324 approximately 55 mm by 10 mm.

Another embodiment of the cooling plate is illustrated in FIG. 12. The cooling plate or heatsink mount 700, having good thermal conductivity qualities, is provided with channels, or grooves, 702 for receiving laser diode bars 708 in a manner described in U.S. Pat. No. 5,284,790, which is incorporated herein by reference. The channels 702 are cut at an angle θ to a major frontal surface 704 of the plate 700.

The angular arrangement of laser bars 708 permits a reduction in the inter-spacing between beams of adjacent laser bars 708, as in previous embodiments, improving the far field optical density resulting in an overall brightness enhancement. It should be noted that the channels 702 may be cut into the surface 704 at a more acute angle than shown in FIG. 12 to further decrease beam inter-spacing of emitters in adjacent laser bars as well as to improve the cooling efficiency. The cooling efficiency is improved with further orientation of heat dissipating major laser bar surfaces 706 more toward the heat withdrawal surface 707 of the high thermally conductive mount 700. The heat withdrawal surface 707 may be in thermal contact with a circulating fluid cooler or thermoelectric cooler. This embodiment may be provided with collimating lenses to produce a total output having reduced dead spaces between outputs of adjacent laser diode bars 708.

Other embodiments of the invention are illustrated in FIGS. 13–15. These embodiments may be regarded as modular embodiments, in comparison with that illustrated, for example, in FIG. 6, which may be regarded as an integrated embodiment. In the modular embodiments, each laser diode bar is mounted on its own mounting block which attaches to a cooling block. Each mounting block is independently separable from the cooling block, so that if one laser bar were to require replacement, the mounting block holding the faulty laser bar may be removed without disturbing the other laser bars.

A first modular embodiment is illustrated in FIG. 13. A cooling block 800 is provided with a number of stepped faces 802. Each stepped face 802 can receive a mounting block 804 that has a laser diode bar 805 and collimating lens mounted on an upper surface. For clarity, only the mounting blocks 804 mounted at each end of the cooling block 800 are illustrated. Each mounting block 804 may be fixably attached to the cooling block 800, for example using a bolt 812 that passes through the clearance hole 806 in the cooling block 800 and is received in a respective threaded hole on the underside of the mounting block 804.

The cooling block 800 may be provided with two channels to deliver and remove a liquid coolant. One channel is illustrated in the figure, the other being hidden from view. The liquid coolant channel includes a plenum 814 connected via a manifold to a number of outlet holes 810 that connect to respective inlet channels in each mounting block. Seals, such as o-ring seals, may be provided between the output holes 810 and the inlet channel of each mounting block 804 to prevent leakage of the coolant. A faceplate 818 seals against another o-ring seal 816 to enclose the plenum 814, and is held in place by a number of bolts 824. The faceplate 818 includes a connector 822, sealingly attached thereto. The sealing attachment may be made via another o-ring sitting in on the sealing surface 820.

The second coolant channel includes inlet holes 808 that connect to respective output channels in each mounting block 804.

In operation, the coolant passes into the plenum 814 through the connector 822, and is forced up through the outlet holes 810 to pass into each mounting block 804. After passing through the mounting block, 804, the coolant re-enters the cooling block 800 through the inlet holes 808 and is passed out of the cooling block through another faceplate and connector (not illustrated) on the other side of the cooling block 800

Each mounting block 804 may be provided with conductive tabs for making an electrical connection to adjacent mounting blocks 804. The mounting blocks 804 at the ends of the cooling block 800 are connected to end plates 826 and 828 respectively, which are connectable to an external power supply.

FIG. 14 illustrates schematically how an embodiment similar to that illustrated in FIG. 13 operates once assembled. FIG. 14 shows a cooling block 800a having eight mounting blocks 804a mounted in position on the stepped faces 802a. Each mounting block 804a is provided with a laser diode bar 805a and a collimating lens 807a on an upper mounting surface 809a to produce a collimated beam 811a. The difference in height between stepped faces 802a is approximately equal to the height of a collimated beam 811a, so that all the collimated beams 811a propagate closely spaced to each other and no laser diode 805a blocks the beam 811a generated by a neighboring laser diode bar 805a.

The hidden detail (dashed lines) illustrates the plenum 814a connected through coolant ducts 832a to the inlet channels 834a of each mounting block 804a.

Another modular embodiment is illustrated schematically in FIG. 15. Here, the mounting blocks 904 are mounted on a single, flat face 902 of the cooling block 900. Each laser diode 905 is mounted at a height from the cooling block 900 that is dependent on that laser diode's position along the cooling block 900. Thus, each mounting block 904, with the exception of the rightmost mounting block 904, has an associated spacer 936 of a specific height so that its laser diode 905 is positioned at the appropriate height for its position along the cooling block. Each spacer 936 has channels 932 therethrough to pass the coolant between the cooling block 900 and its associated mounting block 904. Each spacer 936 may be held in sealing contact with the cooling block 900 and its associated mounting block 904 to avoid leakage of coolant. The cooling block 900 is provided with a plenum 914 that feeds coolant to the spacer channel 932 and the mounting block channel 934.

Like the embodiment of FIGS. 13 and 14, in this embodiment each mounting block 904 is provided with a laser diode bar 905 and a collimating lens 907 on an upper mounting surface 909 to produce a collimated beam 911. The difference in height between adjacent mounting surface 909 is approximately equal to the height of a collimated beam 911, so that all the collimated beams 911 propagate closely spaced to each other and no laser diode 905 blocks the beam 911 generated by a neighboring laser diode bar 905.

An advantage of this embodiment is that the cooling block 904 has a single, flat surface on which the mounting blocks are positioned, while the laser diode arrays are fixed to mounting blocks all having a similar height. In another approach, that avoids the use of spacers, the diode laser arrays may be fixed to mounting blocks, each of which has a height equal to the combined heights of the spacer 936 and the mounting block 904 it replaces.

FIG. 16 illustrates an embodiment of a mounting block 1004 having an upper mounting surface 1009. A laser diode bar 1005 and submount 1036 are mounted on the upper mounting surface 1009. Hidden detail (dashed lines) shows the inlet channel 1034 that receives coolant from the cooling block. A thin channel 1038 passes close to the upper mounting surface 1009 to be in close thermal contact with the laser diode bar 1005. The thin channel 1038 connects to an outlet channel which passes the heated coolant back to the cooling block. The thin channel 1038 may be a microchannel structure to ensure large heat removal capacity. A threaded, blind hole 1042 may be provided on the lower surface of the mounting block 1004 to receive a mounting screw.

The mounting block may be fabricated from a stack of copper plates pressed together. Holes are provided in each plate, except the top plate, to provide for the inlet and outlet channels 1034 and 1040. The inside face of the top plate is provided with the thin channel 1038, or microchannel structure, that connects with the inlet and outlet channels 1034 and 1040.

The optical quality, i.e., the size-divergence product, of the beams produced by the diode laser bars may be improved by reducing the bow-tie component of the vertical divergence after collimation. This may be achieved by decreasing the horizontal divergence of the laser as measured at the $1/e^2$ points to preferably less than 10° and more preferably less than 6°.

One method of reducing the horizontal divergence is to implement an intracavity angled orating within the laser diode cavity, such as is disclosed in U.S. Pat. No. 5,337,328, owned by the assignee herein and incorporated by reference. High power, broad area stripe laser diodes can suffer from poor beam quality, which arises as a result of the width of the stripe. The inclusion of an angled grating in the diode laser cavity provides improved control over the transverse mode structure, producing a reduced transverse divergence, and thus reducing comatic (bow tie) aberration. The angled grating also reduces the possibility of individual light filaments growing within the stripe. Therefore, the angled grating improves the quality of the beam emitted by the laser diode.

It will be appreciated that other means in or along the internal waveguide sides of the laser cavity, may also be used to reduce the horizontal divergence.

A top view of a laser diode incorporating an angled grating is illustrated in FIG. 9. The semiconductor laser 400 has a broad area pumped gain region 402 defined by edges 404. The optical resonant cavity of the laser 400 is defined between the first reflective end 408 and the second reflective end 410. An angled grating reflector 406 is formed through the gain region 402 between the reflective ends 408 and 410. Side facets 412 and 414 may be anti-reflection coated, or otherwise treated, to reduce the possibility of a transverse Fabry-Perot oscillation mode.

Although there are numerous optical paths within the optical cavity, only a single light path 416 is illustrated for clarity. The cumulative effect of the superposition of all light paths within the laser cavity is an intensity distribution whose envelope delimits a broad region representing the overall path of the beam of light waves oscillating within the cavity. The angled grating reflector 406 is disposed at an angle θ measured perpendicular relative to the reflective ends 408 and 410. θ is preferably in the range of approximately 70° to 85°. Advantages of having a large incident angle θ include an increased grating reflectivity, and an enhancement of the TE-TE reflection mode relative to the less efficient TE-TM reflection mode. Additionally, transverse superradiance and oscillation are reduced. Furthermore, as the angle θ is increased, the pitch of the grating 406 increases, making the grating 406 easier to fabricate.

The angled grating may be applied to a laser diode array, as is illustrated in FIG. 10. The laser diode array 500 has a number of partial or total light blocking regions 502 disposed at an angle over the laser diode bar 504, to form separate angle grating, laser diodes 506. The output 508 from each of the laser diodes 506 has low transverse divergence and is of superior beam quality to conventional laser diode bars. The laser diode bar 500 may be employed in any of the embodiments of the invention disclosed herein.

The embodiments illustrated herein may employ a single collimating lens for each laser diode bar. It will be appreciated that other configurations of collimation optics may be used. For example, the collimating optics may use a two-element lens system, as illustrated in FIG. 11. A laser diode bar 600 has a number of individual emitters 602. A first lens 604 collimates the outputs 606 from the individual emitters 602 along the fast axis. The first lens 604 is followed by a lenslet array 608 that includes an array of cylindrical lenses for focusing each output 606 along its slow axis. The elements 610 of the lenslet array 608 may be adapted so that the outputs 606 from each individual emitter 602 come to a common focus 612. The lenslet array elements 610 may also be adapted simply to collimate the outputs 606 along their slow axes, or to diverge the outputs 606. It will be appreciated that the optical properties of the combination of the first lens 604 and the lenslet array 608 may be reproduced by a single lens that includes focusing along both the fast axis and the slow axis of each emitter 602.

While various examples were provided above, the present invention is not limited to the specifics of the examples. For example, rather than extracting heat from the laser diodes at an angle to the steps in the grooved cooling plate, the heat may be extracted in a direction perpendicular to one of the step faces. Additionally, in the embodiment illustrated in FIG. 15, each mounting block and its associated spacer could be replaced by a single mounting block having a height equal to the combined heights of the original block and its spacer.

As noted above, the present invention is applicable to producing laser diode arrays having high brightness and uniform intensity profiles where the dead spaces between outputs from adjacent laser diodes are minimized. While having use in many different applications, it is believed to be particularly useful in systems for material processing and treatment. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor laser device comprising:
   a substrate having first and second surfaces, the first and second surfaces being substantially parallel, a plurality of angled grooves being formed on the first surface, each of the grooves having a mounting surface disposed at an angle to the second surface, the angle ranging from more than 0° to less than 90°;
   a plurality of laser diode array bars, each laser diode array bar disposed within a respective groove to emit light from an emitting surface at the angle; and
   a plurality of lenses respectively aligned with the laser diode array bars, the lenses reducing divergence of light emitted by the laser diode array bars in at least one dimension.

2. The semiconductor laser device of claim 1 further comprising a liquid cooled block attached to the substrate.

3. The semiconductor laser device of claim 1 wherein the laser diode array bars are mechanically bonded to a submount material having a coefficient of thermal expansion substantially equal to the coefficient of thermal expansion of the laser diode array bars, the submount being mounted on the substrate.

4. The semiconductor laser device of claim 1 wherein the laser diode array bars include laser emitters having a slow-axis beam divergence of less than 8 °.

5. The semiconductor laser device of claim 1 wherein the laser diode array bars include angled grating lasers.

6. The semiconductor laser device of claim 1, wherein at least one of the lenses includes at least one surface having a lenslet array.

7. The semiconductor laser device of claim 1, wherein a dead space between adjacent collimated light beams has a height of less than 100% of a collimated beam height.

8. The semiconductor laser device of claim 7, wherein the dead space has height of less than 10% of the collimated beam height.

9. The semiconductor laser device of claim 1, wherein the lenses have a lens height and are mounted at a distance from their corresponding laser diode arrays where the lens height is substantially equal to a height of the output beam from the laser diode arrays.

10. The semiconductor laser device of claim 1 further comprising heat spreaders mounted in the grooves on the first surface to receive the laser diode array bars.

11. A laser diode array package comprising:
   a mount;
   first and second laser diode arrays disposed on the mount, each of the laser diode arrays defining an optical axis and having an emitting surface lying in an emitting surface plane, the emitting surface plane of the first laser diode array being displaced relative to the emitting surface plane of the second laser diode array in a direction parallel to one of the optical axes, the optical axes of the first and second laser diode arrays being offset from each other in a direction perpendicular to one of the optical axes; and first and second lenses disposed relative to respective emitting surfaces to reduce divergence of light output from the emitting surfaces.

12. The laser diode array package of claim 11, wherein the mount includes grooves disposed on a first surface, and the first and second laser diode arrays are mounted on mounting surfaces of respective grooves.

13. The laser diode array package of claim 12, wherein the mount is attached to a liquid cooling unit so as to extract heat through the mount in a direction substantially non-perpendicular and non-parallel to the optical axes.

14. The laser diode array package of claim 11, wherein the mount includes first and second detachable blocks, and the first and second laser diode arrays are mounted on the detachable blocks.

15. The laser diode array package of claim 11, wherein at least one of the lenses includes at least one surface having a lenslet array.

16. The laser diode array package of claim 11, wherein a dead space between adjacent divergence-reduced light beams has a height of less than 100% of a divergence-reduced beam height at a lens output.

17. The laser diode array package of claim 16, wherein the dead space has a height of less than 10% of the beam height.

18. The laser diode array package of claim 11, wherein the lenses are mounted relative to their corresponding laser diode arrays so that light output from each laser diode array essentially fills respective output surfaces of each lens.

19. The laser diode array package of claim 11, wherein the laser diode arrays include lasers with angled gratings.

20. A semiconductor laser diode array, comprising:

means for producing laser beams from laser diodes, the laser beams having respective optical axes;

means for reducing divergence of the laser beams in at least one direction; and means for mounting the laser diodes on a cooler with emitting surfaces of the laser diodes offset from each other in a direction parallel with at least one of the optical axes.

21. A laser diode array as recited in claim 20, wherein the producing means, divergence reducing means and mounting means are positioned so as not to substantially occlude any of the divergence-reduced laser beams.

22. A laser diode array as recited in claim 20, wherein the mounting means includes a first surface with grooves disposed thereon, each groove having a laser diode mounting surface that is set an angle, $\theta$, relative to the first surface, where $0° < \theta < 90°$.

23. A laser diode array as recited in claim 20, wherein the mounting means includes blocks detachably mounted on the cooler, laser diodes being mounted on respective blocks.

24. A laser diode array as recited in claim 23, wherein the blocks have essentially the same height and are detachably mounted on respective steps of a stepped face of the cooler.

25. A laser diode array as recited in claim 23, wherein the blocks have essentially the same height and are detachably mounted on spacers that are mounted on a flat face of the cooler, the spacers having different heights, the heights increasing for spacers from a first end of the cooler to a second end.

26. A method of operating a laser diode bar array, comprising:

producing laser beams from laser diodes, the laser beams having respective optical axes;

reducing divergence of the laser beams in at least one direction; and mounting the laser diodes on a cooler with emitting surfaces of the laser diodes offset from each other in a direction parallel with at least one of the optical axes.

27. The semiconductor laser device of claim 1, further comprising a metal conductor coupled between a first side of one of the laser diode array bars and a second side of an adjacent laser diode array bar for conducting current between the one of the laser diode array bars and the adjacent laser diode array bar, the metal conductor being separated from the substrate.

* * * * *